(12) United States Patent
Harwood et al.

(10) Patent No.: US 12,069,833 B2
(45) Date of Patent: Aug. 20, 2024

(54) SMART ARM FOR USE WITH MULTIMEDIA POLE AND OTHER STRUCTURES

(71) Applicants: Ronald P. Harwood, West Bloomfield, MI (US); Anthony Reale, Farmington, MI (US)

(72) Inventors: Ronald P. Harwood, West Bloomfield, MI (US); Anthony Reale, Farmington, MI (US)

(73) Assignee: Ronald P. Harwood, Farmington Hills, MI (US)

( * ) Notice: Subject to any disclaimer, the term of this patent is extended or adjusted under 35 U.S.C. 154(b) by 507 days.

(21) Appl. No.: 17/369,240

(22) Filed: Jul. 7, 2021

(65) Prior Publication Data
US 2022/0015261 A1   Jan. 13, 2022

Related U.S. Application Data

(60) Provisional application No. 63/049,355, filed on Jul. 8, 2020.

(51) Int. Cl.
*H05K 7/20* (2006.01)
*E04H 12/24* (2006.01)
*F21V 21/108* (2006.01)
*G05D 23/19* (2006.01)
*F21S 8/08* (2006.01)

(52) U.S. Cl.
CPC ......... *H05K 7/20209* (2013.01); *E04H 12/24* (2013.01); *F21V 21/108* (2013.01); *G05D 23/1917* (2013.01); *H05K 7/20136* (2013.01); *F21S 8/086* (2013.01)

(58) Field of Classification Search
CPC .......... E04H 12/24; F21S 8/086; F21V 21/10; F21V 21/108; G05D 23/1917; G09F 19/22; G09F 27/005; H05K 7/20136; H05K 7/20209
See application file for complete search history.

(56) References Cited

U.S. PATENT DOCUMENTS

| 7,972,036 | B1 * | 7/2011 | Schach | F21V 29/773 |
| | | | | 362/345 |
| 9,839,093 | B1 * | 12/2017 | Blanchard | H05B 45/56 |
| 2012/0038281 | A1 * | 2/2012 | Verfuerth | H05B 45/10 |
| | | | | 315/152 |
| 2014/0036521 | A1 | 2/2014 | Elliott | |
| 2014/0104859 | A1 | 4/2014 | Araman | |
| 2015/0021990 | A1 | 1/2015 | Myer | |
| 2015/0276192 | A1 * | 10/2015 | Kafry | F21V 23/003 |
| | | | | 362/362 |
| 2015/0362172 | A1 * | 12/2015 | Gabriel | F21V 11/16 |
| | | | | 348/151 |
| 2017/0307192 | A1 * | 10/2017 | LaFemina | E04H 12/24 |
| 2018/0045388 | A1 * | 2/2018 | McDowell | F21V 29/15 |

(Continued)

FOREIGN PATENT DOCUMENTS

CA 3073830 * 8/2018

*Primary Examiner* — Zheng Song
(74) *Attorney, Agent, or Firm* — Quinn IP Law

(57) ABSTRACT

Multimedia poles, light poles and/or other structures capable of facilitating multiple operations, such as sensing, lighting, messaging, etc., optionally in a connected manner whereby devices positioned at different locations may communication to implement coordinated activities, are contemplated.

16 Claims, 13 Drawing Sheets

(56) References Cited

U.S. PATENT DOCUMENTS

| | | | |
|---|---|---|---|
| 2018/0238526 A1* | 8/2018 | Rocchio | F21V 21/108 |
| 2018/0288860 A1* | 10/2018 | Vendetti | H05B 47/19 |
| 2020/0109831 A1* | 4/2020 | Daghistani | F03G 6/045 |
| 2022/0136682 A1* | 5/2022 | Portolani | F16B 3/00 |
| | | | 362/410 |

* cited by examiner

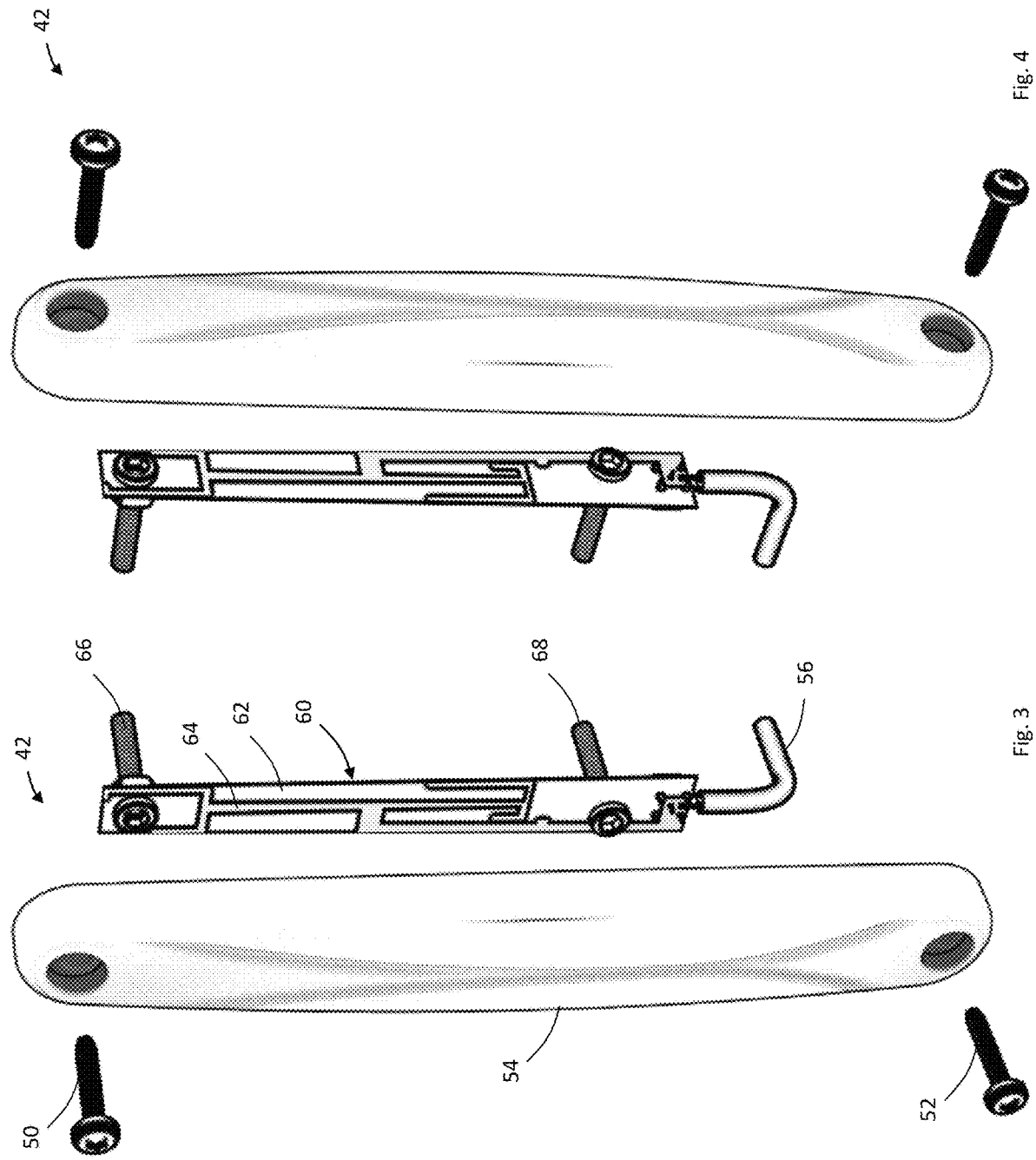

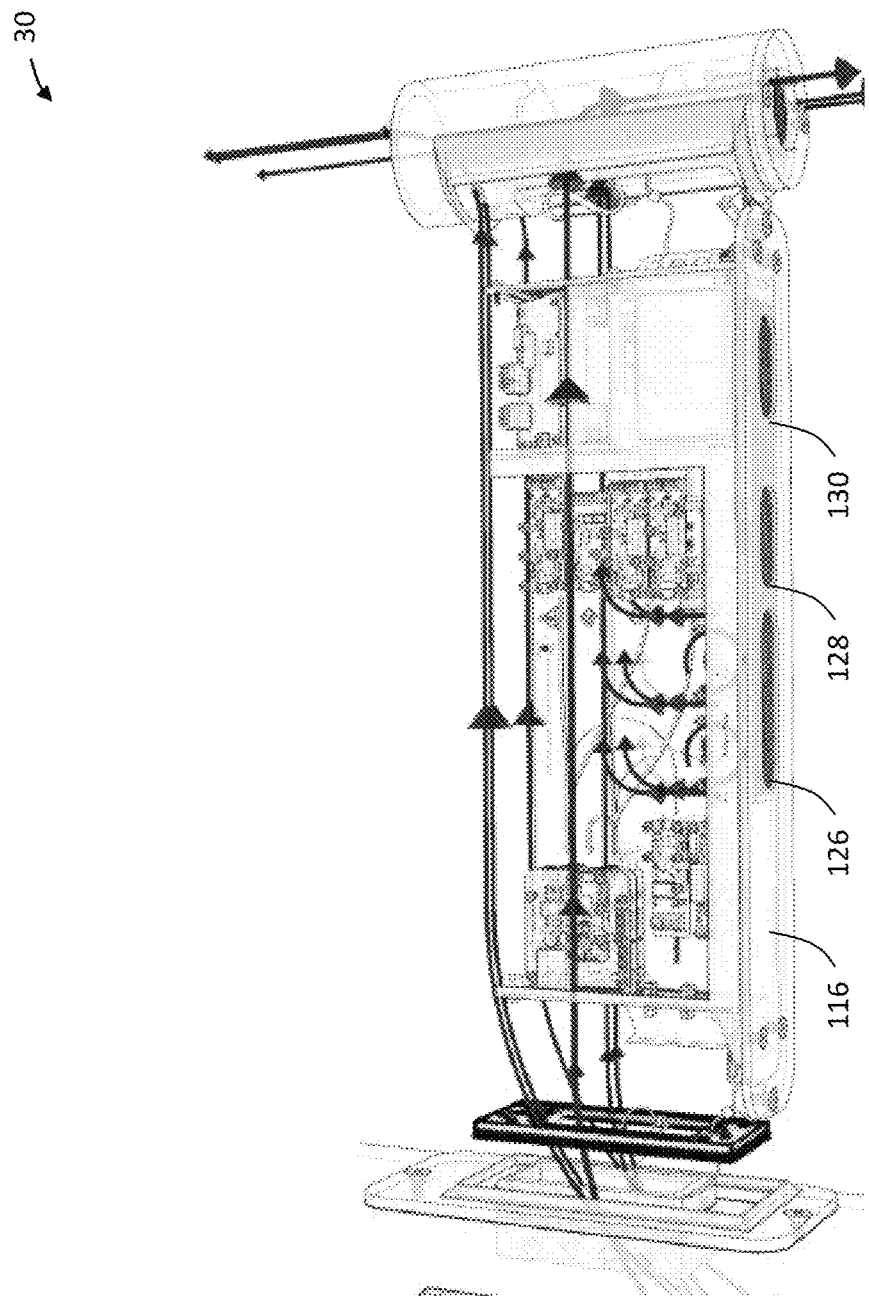

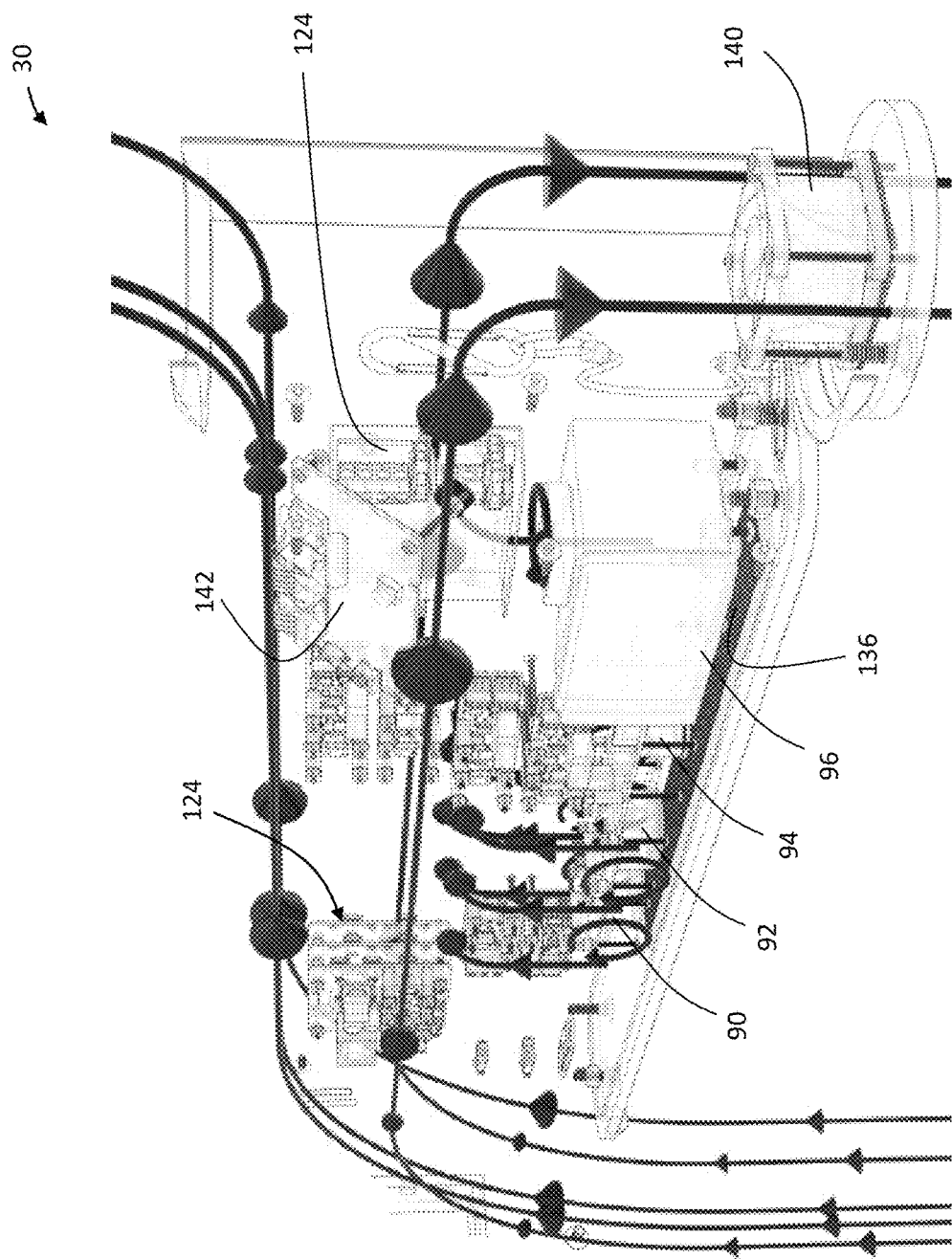

SMART ARM FOR USE WITH MULTIMEDIA POLE AND OTHER STRUCTURES

CROSS-REFERENCE TO RELATED APPLICATIONS

This application claims the benefit of U.S. provisional application No. 63/049,355 filed Jul. 8, 2020, the disclosure of which is incorporated in its entirety by reference herein.

TECHNICAL FIELD

The present invention relates to multimedia poles, light poles and/or other structures capable of facilitating multiple operations, such as sensing, lighting, messaging, etc., optionally in a connected manner whereby devices positioned at different locations may communication to implement coordinated activities.

BACKGROUND

Intellistreets™ is a wireless, disruptive technology that crosses all traditional boundaries. It is the new heartbeat of outdoor and indoor public spaces. With public and private sectors moving quickly toward outdoor LED light change-outs, fiber and small cell installations, Intellistreets seamlessly adds IoT Data Network, Sustainability Management, Security and Entertainment. The Intellistreets common operating platform is a single, low cost, scalable multimedia network, which in a cloud-based architecture, enables cities, campuses and malls to collect all forms of data, make decisions, and "talk" directly to pedestrians and motorists—by street, district or area. In the world of Big Data and the IoT, Intellistreets is the cloud-based engine useful "at edge" to leverage the most valuable real estate in the city; the lamp post. While the present invention is not necessary limited to lamp posts or street poles, lamp post, street poles, water towers, signage or other infrastructure at the edge of Intellistreets™ or other wireless networks may be in need of wireless antennas capable of being reliable deployed in such environments to support the attendant wireless needed to enable cellular, mesh, Wi-Fi or other types of wireless communications.

BRIEF DESCRIPTION OF THE DRAWINGS

FIGS. 3-5 illustrates multiple views of an antenna in accordance with one non-limiting aspect of the present invention.

FIGS. 12-14 illustrate a faceplate of the housing being removed in accordance with one non-limiting aspect of the present invention.

FIG. 15 illustrates a schematic overview of airflow through the smart arm in accordance with one non-limiting aspect of the present invention.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
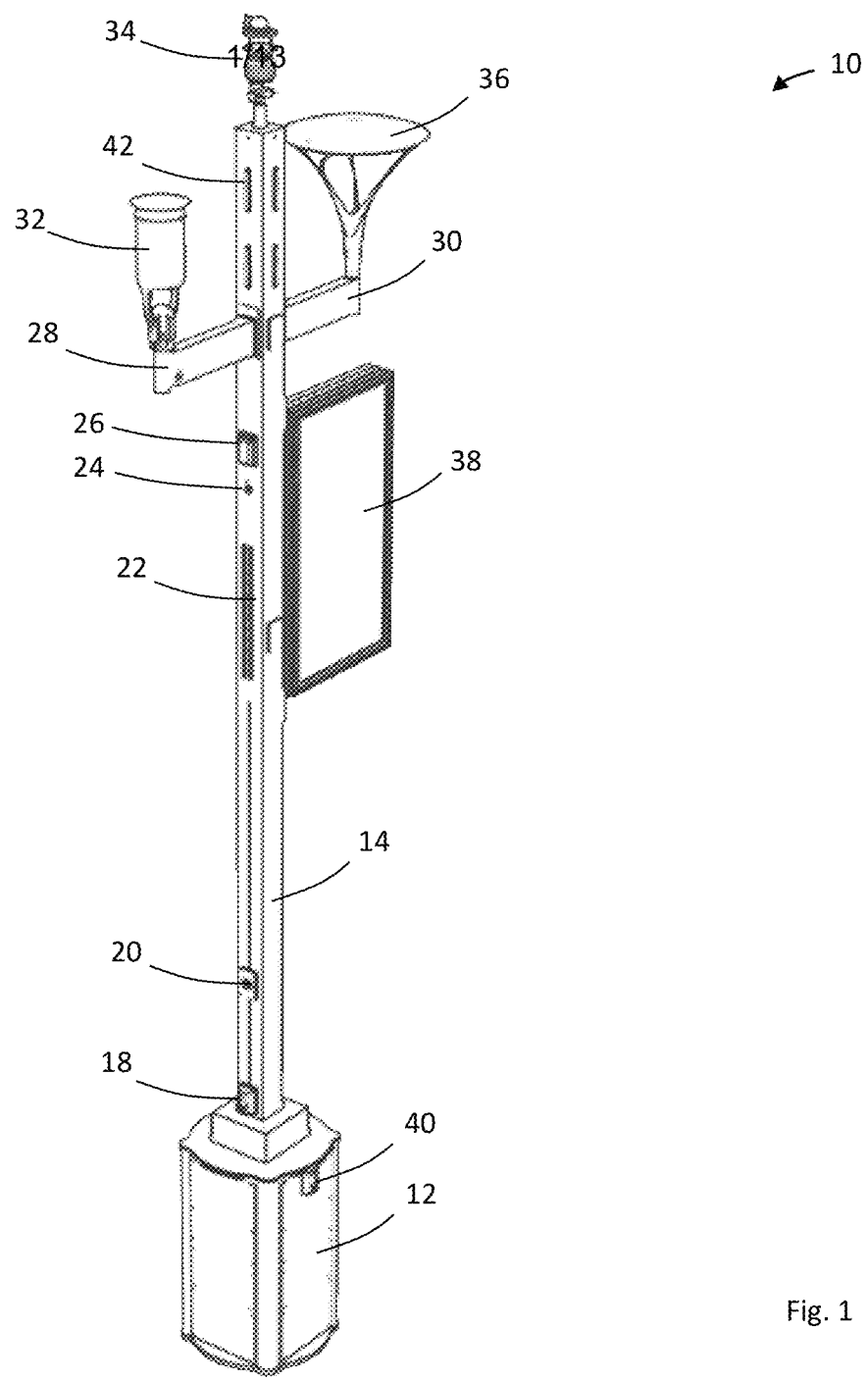
FIG. 1 illustrates an integrated, multimedia light pole in accordance with one non-limiting aspect of the present invention.

FIG. 1 illustrates an integrated, multimedia light pole 10 in accordance with one non-limiting aspect of the present invention. The light pole 10 may be particularly advantageous in facilitating implementation of an Intellistreets™ network or other wireless network where wireless signaling may be exchanged between user/client devices (not shown) and the light pole 10 and/or between the light pole 10 and wireless componentry included on additional light poles, water towers, buildings or other infrastructures (not shown). While the present invention fully contemplates its use and application with Wi-Fi, cellular, radio, Bluetooth, Zigbee, etc., the light pole 10 is predominantly described with respect to facilitating implementation of an Intellistreets™ network, such as according to the operations, infrastructures and processes described in U.S. Pat. Nos. 7,630,776 and 9,812,171, and U.S. provisional application No. 62/821,486, the disclosures of which are hereby incorporated in their entireties by the reference herein.

The light pole 10 may include a number of features to facilitate multimedia related operations, lighting, signaling exchange, alerts, notifications, environmental sensing, etc. and is illustrated for exemplary non-limiting purposes as including certain componentry/features to facilitate those operations. One non-limiting aspect of the present invention contemplates the light pole 10 having a base 12 with an elongated body 14 extending therefrom to support the various componentry, such as the illustrated USB port 18, emergency button 20, grill speaker 22, ethernet port 24, electrical outlet 26, smart arms 28, 30, pole top module (PTM) 32, weather station 34, luminaire 36, digital banner 38, base button 40 and a plurality of antennas 42. This and/or other componentry may be included with the light pole 10 to facilitate any number of operations, including sustainability, security and community engagement operations.

The use of LEDs and other sustainable features may enable the light pole 10 to achieve up to 70% energy reduction over existing sources; to save valuable energy through adjustment of lighting levels via programming or on-demand; to provide lighting and thermal management that can extend system life with on-board sensor input analysis; and/or to provide accurate reporting and monitoring of streetlighting systems in a manner that saves maintenance, energy and administration costs. The capability to provide wireless signaling support may enable a wireless mesh system using bi-directional, multi-media communication between individual luminaires/streetlights and a web-based user interface; audio storage and playback capability for mass notification concealed in light poles or light fixtures; egress wayfinding with programmable and simultaneous routing via sequenced lights, graphic banners and audio; encrypted control interface for robust security against hacking and misuse; in real time dial-up lighting control and multimedia features with mobile devices. The community engagement capabilities may enable an integral component to the environmental streetscape, enhancing the pedestrian experience through a wide variety of multimedia options; dynamic lighting whereby wireless control of color-changing accessory lights can facilitate the transformation of an ordinary space for a special event; the use of audio broadcast from playlists using simple drag-and-drop interface acts like a standard; and full range audio that can eliminate conduit and cabling costs in comparison to wired audio systems.

The light pole 10 may include an electronic control module (ECM) or a controller (not shown) within the base 12, which may optionally be accessible through a removable panel opened with base button 40. The base may provide the aesthetically concealed panel to facilitate programming, servicing or otherwise attending to the controller, power supply or other circuitry included within the light pole 10 to support the described operations and processes. The controller may include a processor having capabilities sufficient to facilitate the contemplated operations and processes according to execution of a corresponding plurality of instructions stored on a non-transitory computer-readable medium associated therewith. The plurality of instructions may be sufficient to facilitate environmental awareness; audio recording; visual recording; sensor/data collection; two-way street-level communication; weather, air quality and flood sensing; audio notification; flash or directional wayfinding; flasher notification; incident specific messaging with optional LED banner triggered by sensor or schedule; holiday lighting control; vendor cart and musician receptacle; vacate or feature control flood lighting; extended community dwell time; music playback; evacuation announcements; news update; locating persons in distress; emergency call station; shelter location; food, water and fuel identification; etc.

The PTM 32 may operate according to instructions from the controller and/or include self-directed control. The PTM 32 may be designed for use with LED luminaires, but can be adapted to other light sources to provide a full set of lighting control, monitoring, and multimedia options. The PTM 32 may capabilities to control lighting; connect LED wayfinding devices and DMX controlled lighting; provide sound system for background music; message playback and paging capabilities; input connections for a variety of environment sensing devices; and/or provide 360° cameras. The PTM 32 may operate with a cloud-based web interface and content storage system to allow a secure yet robust portal for accessing all the features of the system. The smart arms 28, 30 and/or a sensor/camera included therein may operate with the PTM 32 to provide a platform to assist institutions in protecting its citizens and critical infrastructure. It may include capabilities for image sensing; proximity sensing; pedestrian counting; homeland security; incident camera with at edge processing; augmentation to existing surveillance systems; 48-hour recording/instant access to recordings; and street-level view.

The digital banner 38 may be an LED banner constructive of a rugged IP 65 rated LED display having brightness and contrast sufficient to enable direct sunlight viewing while optionally also being designed to resemble a typical double-cited vinyl banner. The banner 38 may be controlled to deliver its messaging to a surrounding area, including, such as with a 4 mm pitch LED display and video playback module. The emergency button 20 may be a push-button call system capable for automatic communicating with an emergency communication device designed for the public to easily call for help when needed. A microphone and speaker may be included as part of the button 20 to allow for quick, wireless two-way communication with help responders. The emergency button 20 made include a high visibility backlit face, integrated microphone and stainless-steel design. When activated, the emergency button 20 may provide a pre-recorded announcement heard over a speaker in the PTM 32, make a call to a secure phone, provide light flashes and/or other auditory notifications.

Figure 2:
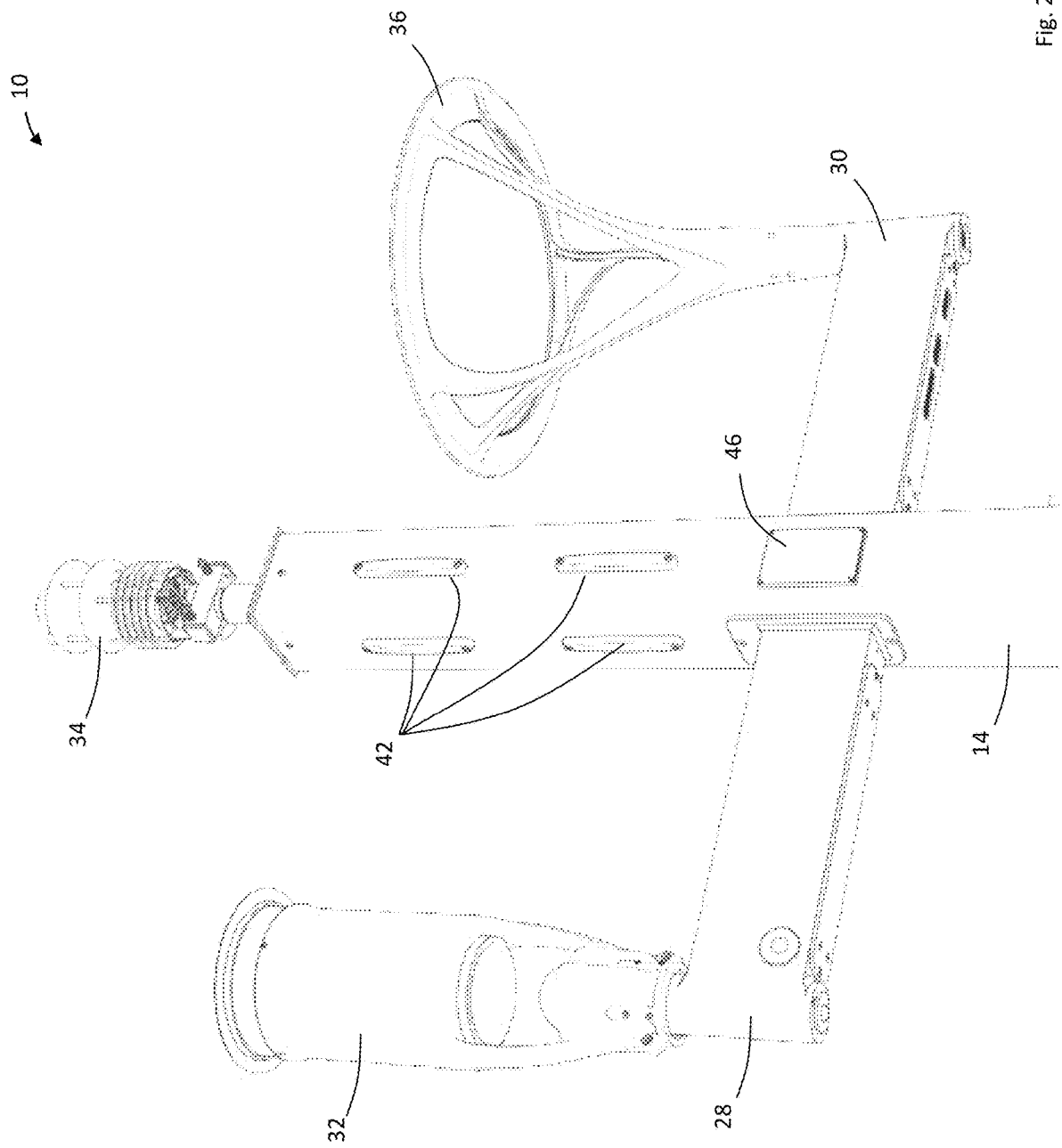
FIG. 2 illustrates an upper portion of the light pole in accordance with one non-limiting aspect of the present invention.

FIG. 2 illustrates an upper portion of the light pole 10 in accordance with one non-limiting aspect of the present invention. The upper portion may correspond with a top end of the body 14 used to attach the smart arms 28, 30, the PTM 32, the weather station 34 and the plurality of antennas 42. The smart arms 28, 30 may include controllers to facilitate correspondingly controlling the PTM 32 and/or luminaire 36 and/or other componentry to facilitate the operations associated therewith, such as according to signaling from the controller included in the base 12. The body 14 may be hollow to facilitate routing wiring (not shown) through an interior thereof for interconnecting componentry of the light pole 10, i.e., to interconnect the various componentry with the controller and/or other controllers or componentry attached to the light pole 10, e.g., to electrically connect exterior receptacles to a power supply of the light pole 10 or permit wired communications between multiple components. A removable panel 46 may be included to facilitate accessing the internal wiring. The smart arms 20, 30 and other componentry attached to the body 14 may be similarly removable, such as with threaded or other fasteners, to facilitate multiple configurations for the light pole 10 and easy access to interior wiring and circuitry.

One non-limiting aspect of the present invention contemplates a plurality of antennas 42 being attached to an exterior of the light pole 10 in order to provide 360° of signaling coverage, such as in the illustrated manner where antennas may be attached to each side of the body portion 14. Additional coverage and/or capabilities may be provided with more than one antenna being attached to some or all sides of the body portion 14, e.g., the upper antennas 42 may be used to facilitate one type of signaling and the lower antennas 42 may be used to facilitate another type of signaling. More than the illustrated upper and lower antennas 42 may be included to facilitate additional signaling, such as to facilitate signaling at different frequencies using antennas having different radiation patterns, etc. The antennas 42 contemplated by the present invention are believed to be particularly beneficial in facilitating attachment to light poles and/or other infrastructure, such as at the time of manufacturing or after deployment when the attachment and operation may be subjected to potentially harsh weather conditions and other environmental influences necessitating a robust and reliable operation.

Figure 5:
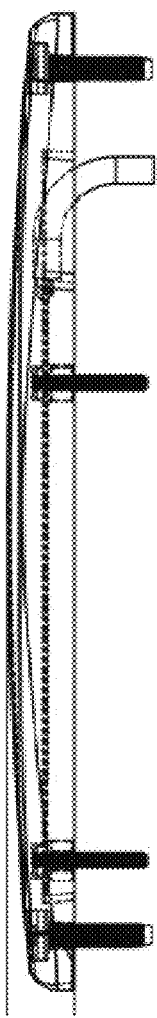

FIGS. 3-5 illustrates multiple views of the antenna 42 contemplated by one non-limiting aspect of the present invention. The antennas 42 are shown to be attached to an exterior of the body portion 14 using removable fasteners 50, 52 extending through apertures included at distal ends of a housing 54. The multipoint attachment may be beneficial in comparison to antennas having a single attachment location, e.g., antennas threaded at one end into a receptacle, as such single attachment-type antennas, especially in the potentially harsh environment associate with light poles, may experience levering forces from wind and/or animals pressing the end of the antenna opposite to the single, attachment location. The corresponding levering forces can increase with distance to cause an undesirable torque, which may potentially lead to failure or inconsistent operation. The antenna housing 54 contemplated by the present invention may essentially eliminate such undesirable forces with the multiple points of attachment, and optionally further limit stress and strain by being sized and shaped to rest flat against the body portion 14 and/or within flutes or other reliefs of the body portion.

The surface-mount nature of the illustrated antennas 42 may be useful in maximizing securement and/or minimizing torque/levering forces, which may be beneficial in achieving optimal robustness and operational permanence. The wiring and/or other electrical connections needed to interconnect the antenna 42 with the controller or other componentry of the light pole 10 may be accessible through a connector 56 included on a rearward side. The housing 54 may be configured to a conductor 60 capable of radiating in a manner sufficient for wireless communications, which are shown for exemplary purposes to include first and second traces 62, 64. The traces 62, 64 may be planar in shape and formed in a stamping or other suitable process whereby the resulting conductor 60 provides a fractal-type of antenna structure. The connector 56 may be soldered or otherwise electrically connected at one end to the conductor 60 and include a shielding material extending therefrom such that a portion of the connector 56 is encased within the housing 54 and a portion of the connector protrudes from the housing. The connector 56 may be sealed within the housing material such that the connector 56 cannot be disconnected from the conductor without unsealing the housing 54 or otherwise exposing the conductor 60 to the ambient environment The connector 56 may extend from the housing 54 two interconnect with the wiring or other electrical interface to the controller or other system backbone. The traces 62, 64 may be stamped from copper and include a first pattern on one side and a second pattern another side, the first and second patterns being different and cooperating to resonate at the one or more frequencies. A pair of positioning elements 66, 68 are shown to be similarly, partially encased within the housing to facilitate positioning the conductor 60 within a mold (not shown) used to form the housing 54. The positioning elements 66, 68 may be threaded elements to facilitate additional attachment to the light pole 10 and/or formed of non-conducting, brittle material capable of being manually clipped such that a portion of the positioning elements protruding from the housing 54 may be manually removed after being molded without unsealing the housing or otherwise exposing the conductors to the ambient environment.

The housing 54 may be formed in a molding process whereby material may be poured into the mold to encase the conductor 60 and other illustrated features. The material may be radio frequency (RF) neutral and electrically isolating, such as a rigid or semi-rigid epoxy or potting material, so as to isolate the conductor 60 from the body portion 14 and to waterproof and hermetically seal the conductor 60 and other components therein. The antenna 42 may be constructed in illustrated manner such that an entirety of the conducting elements are sealed within the housing 54 and/or shielding included on the electrical connector 56 such that there are no PCBs, processors or other electronics within the housing 54, which may be beneficial in ensuring robustness and maximizing reliability. The pouring of epoxy or other material to encase the conductor 60 and other non-electronics may be particularly beneficial in this regard as any gaps or separation between the traces 62, 64 and other conducting componentry may be filled with the material for mutual, electrical isolation.

Figure 7:
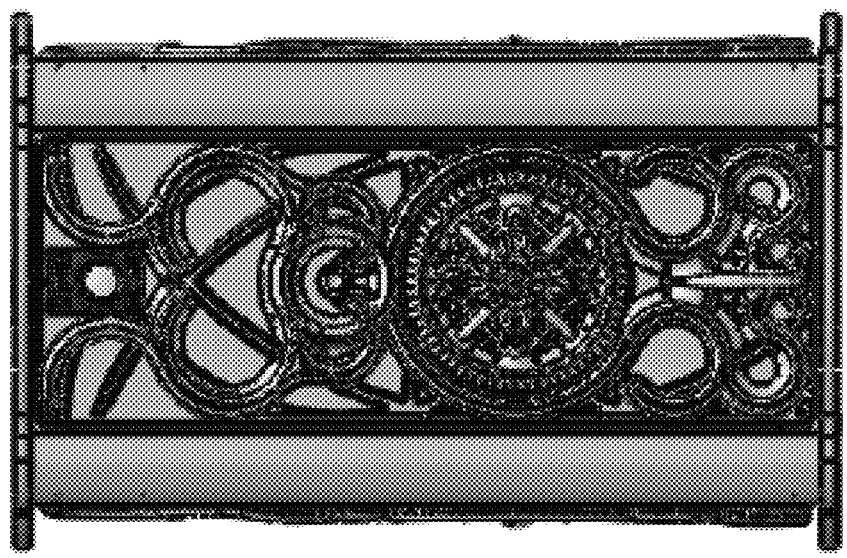
FIG. 7 illustrates a base for a light pole in accordance with one non-limiting aspect of the present invention.
Figure 6:
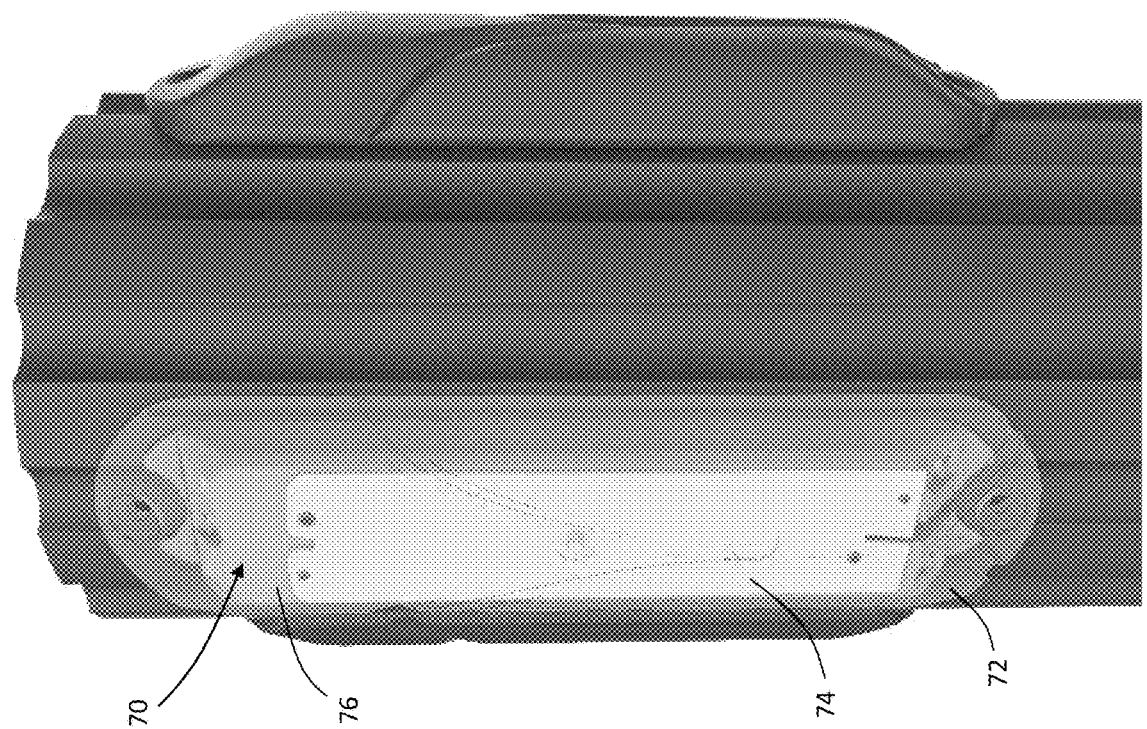
FIG. 6 illustrates a patch antenna in accordance with one non-limiting aspect of the present invention.

FIG. 6 illustrates a patch antenna 70 contemplated by one non-limiting aspect of the present invention. The antenna 70 may include a housing 72 for attaching to the light pole or other object, such as to enable attachment to deployed light poles or other such objects in a manner intended to thwart vandalism, to allow amplifiers to be put elsewhere and/or to provide color anesthetics for antenna deployments. The housing 72 may be used with antenna conductor printed on a PCB 74 whereby the antenna may be offset or electrically isolated from metal of a light pole with a poured epoxy filler or other material 76, which may be optionally fastened or otherwise positioned between the antenna and the light pole, with a RF neutral plastic or polymer shield 78 covering the antenna and fastening the structure to the light pole. The patch antenna 70 may be attached to the light pole described above using multiple points of contact with the body portion. The body portion may optionally be connected to a base 80 similar to that described above having a more ornamental type of design, such as that illustrated in FIG. 7 and described in U.S. provisional No. 62/721,734, the disclosure of which is hereby incorporated by reference in its entirety.

Figure 8:
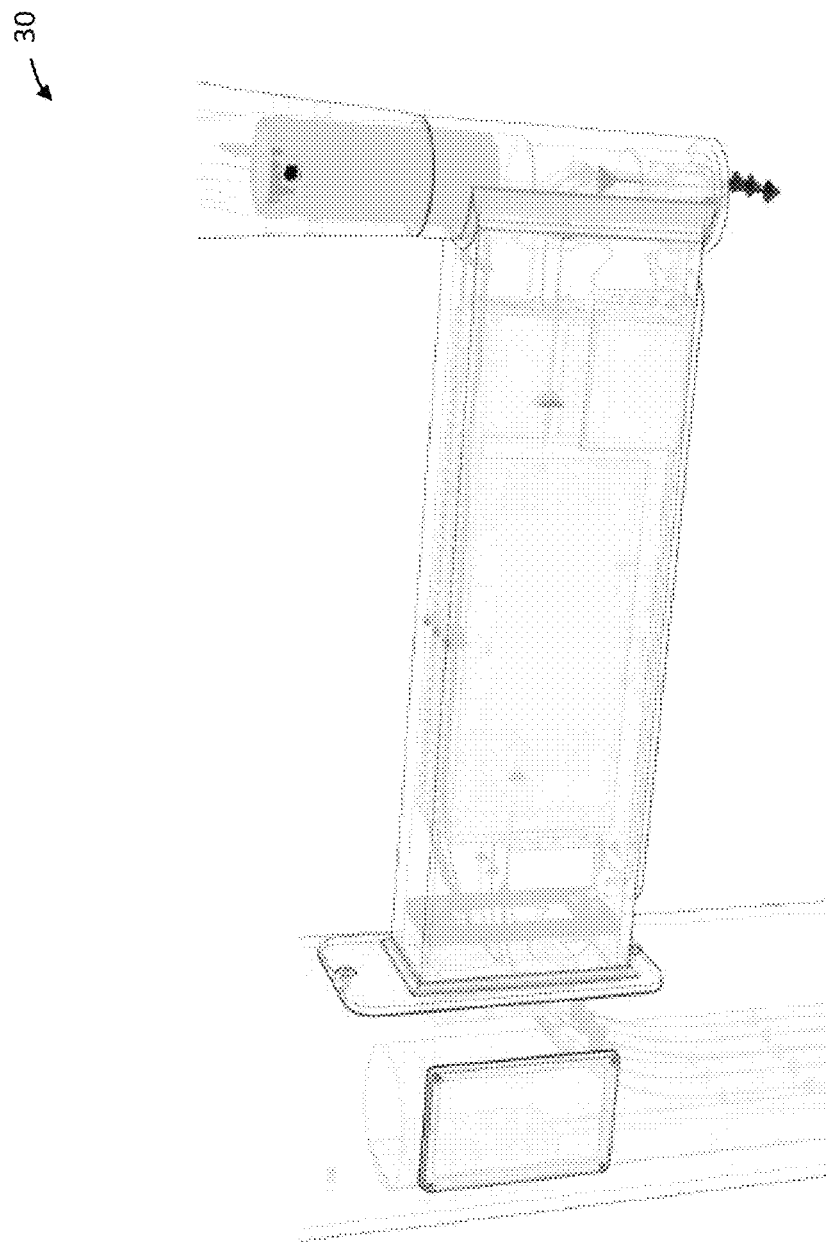
FIGS. 8 and 9 respectively illustrate top and bottom views of the smart arm in accordance with one non-limiting aspect of the present invention.
Figure 9:
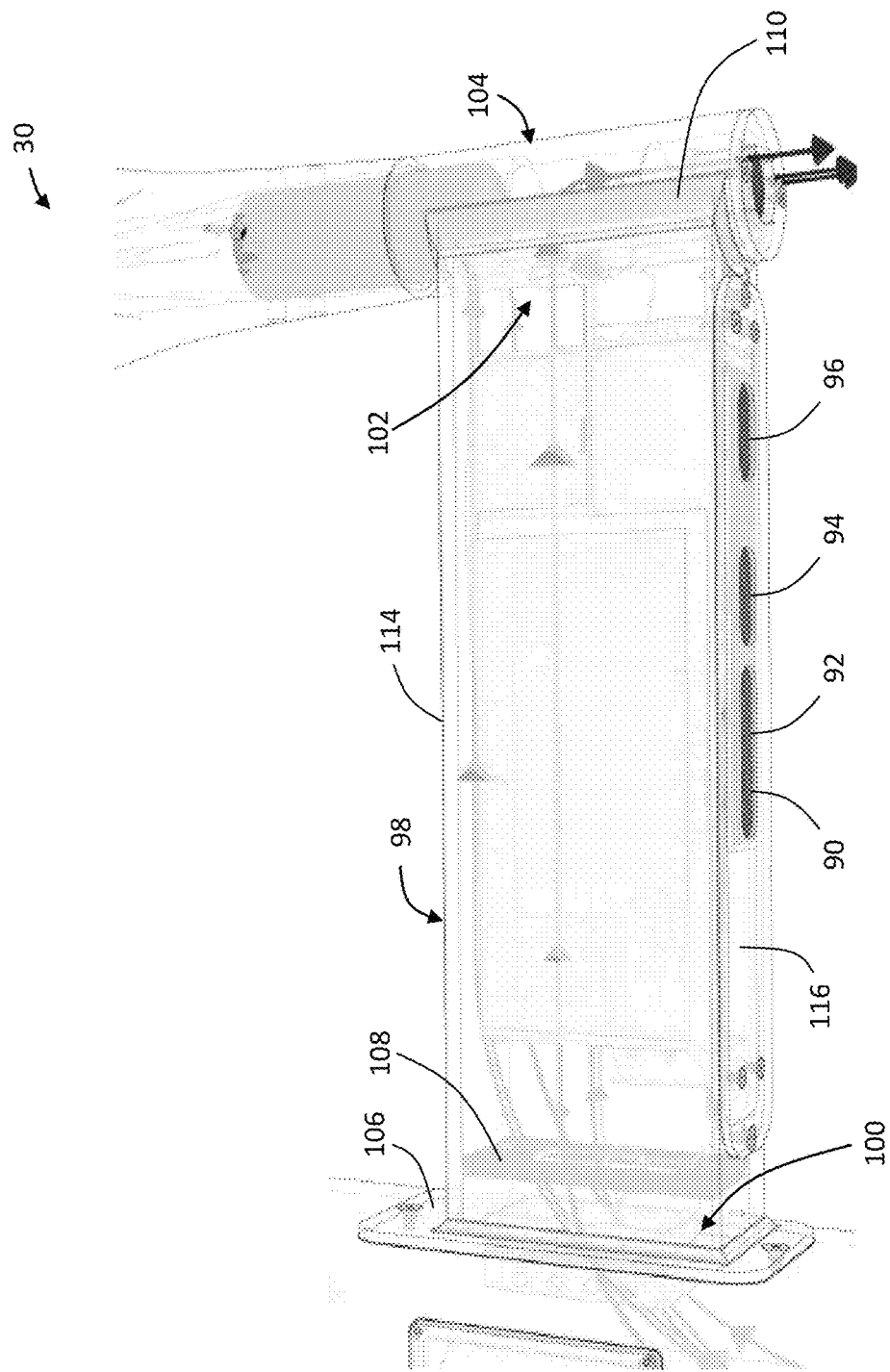

FIGS. 8 and 9 respectively illustrate top and bottom views of the smart arm 30 in accordance with one non-limiting aspect of the present invention. The smart arm 30 may include various componentry, circuits, modules, processors, etc. to facilitate controlling features of the associated light pole or other attached structure and/or to facilitate other operations, such as the illustrated sensing and monitoring configuration whereby a plurality of sensors 90, 92, 94, 96 may be used to sense conditions within an ambient environment. While various management devices may be included to facilitate sensing and monitoring the ambient environment, one non-limiting aspect of the present invention contemplates the smart arm including an air quality sensor (ozone) 90, a nitrous oxide sensor 92, a carbon dioxide sensor 94 and a particle sensor 96. A housing 98 may define a passageway from an inlet 100 proximate the light pole 14 to an outlet 102 proximate a tenon 104 whereby brackets 106, plates 108, welds 110 or other features may be included to facilitate attaching to the light pole 14 and tenon 104, which are shown for exemplary purposes to include fasteners for removably attaching to the light pole 14 and the weld 110 for permanently attaching to the tenon.

Figure 10:
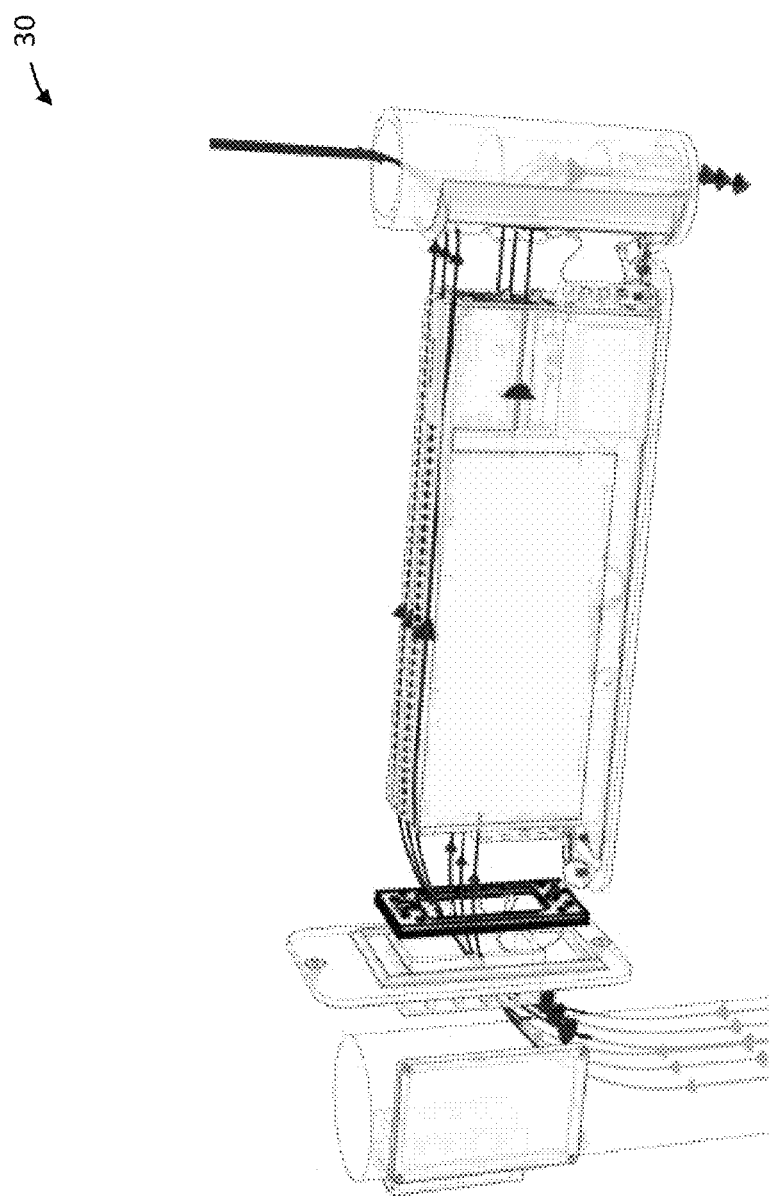
FIGS. 10 and 11 illustrates a top cover of the housing being removed in accordance with one non-limiting aspect of the present invention.
Figure 11:
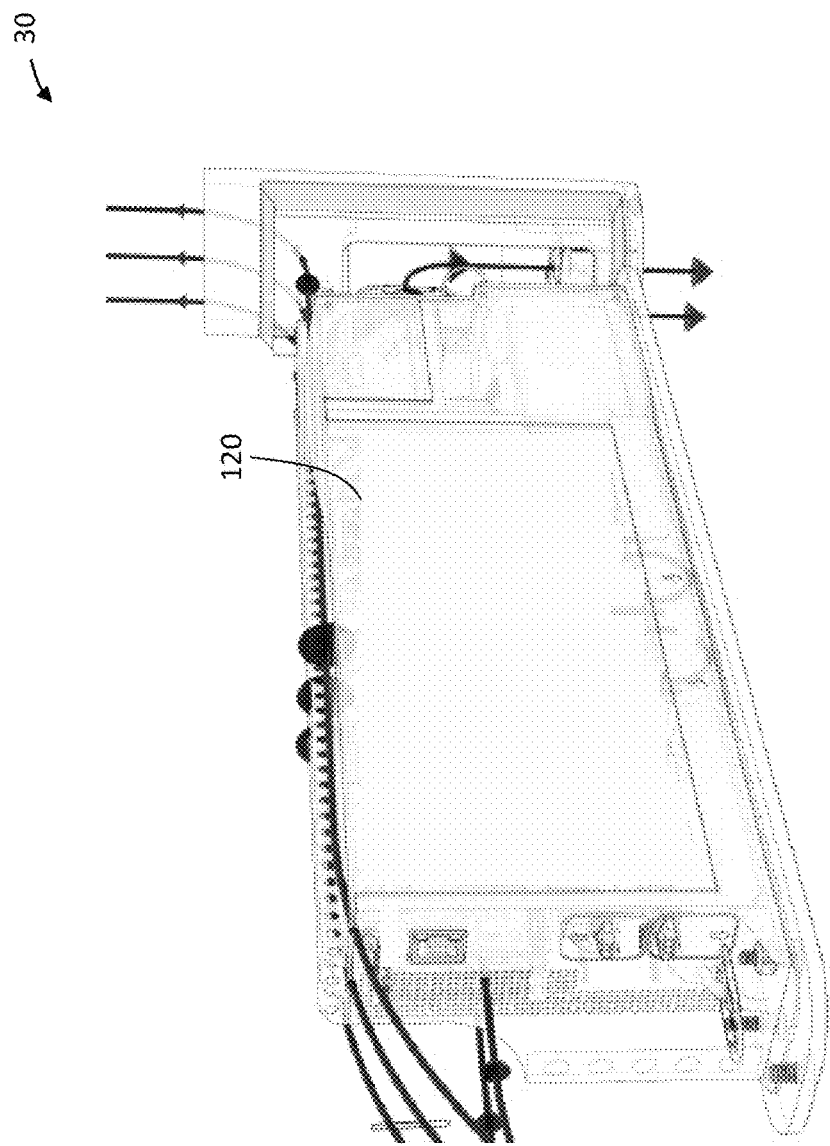

FIGS. 10 and 11 illustrates a top cover 114 of the housing 98 being removed in accordance with one non-limiting aspect of the present invention. The top cover 114 may be removed by unthreading or otherwise releasing fasteners included within a bottom plate 116 of the housing 98. A plurality of reference lines may be used to designate a direction of airflow through the passageway whereby arrows generally illustrate the airflow entering the inlet 100 from an interior of the light pole 14 and exiting the outlet 102 through a T-shaped duct of the tenon 104. The inlet and outlet 100, 102 may include a plurality of apertures to facilitate directing airflow therethrough, such as in the illustrated manner whereby the apertures on the inlet 100 extend substantially heightwise across an entirety of the inlet 10 and the apertures at the outlet 102 extend heightwise across of the outlet 102 by a lesser amount and widthwise across the outlet by a greater amount. The positioning of the apertures in this manner, particularly when combined with the vertically aligned control modules and relative spacing of the sensor componentry, may be advantageous in facilitating airflow paths within the passageway sufficient to maximize cooling.

Figure 12:
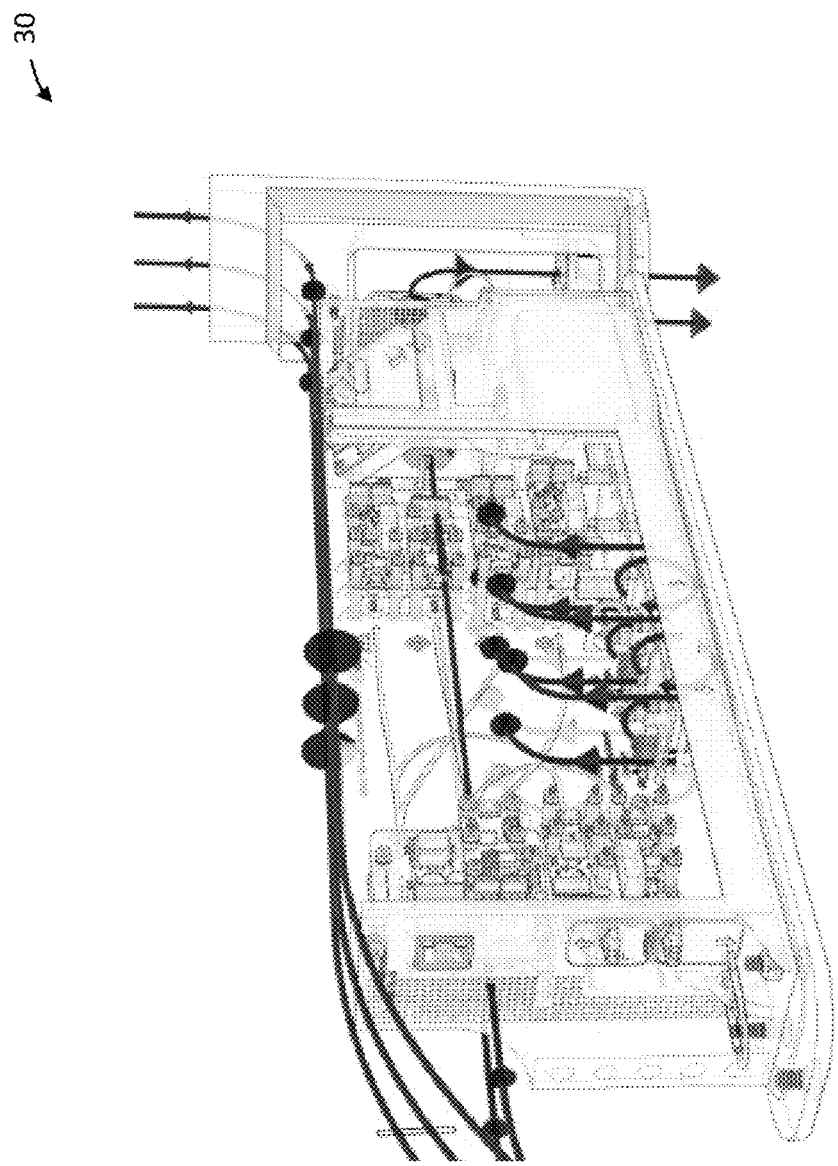
Figure 13:
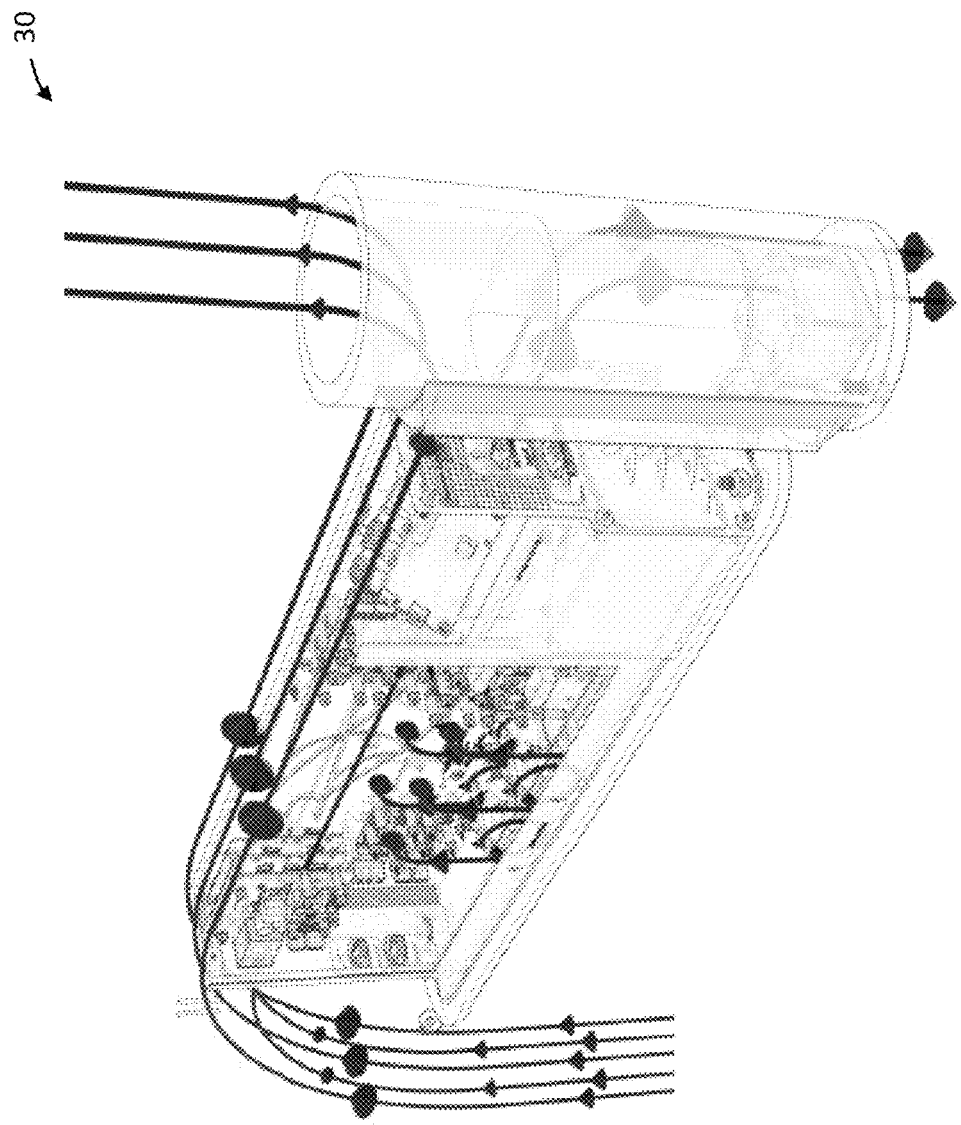

FIGS. 12-14 illustrate a faceplate 120 of the housing 98 being removed in accordance with one non-limiting aspect of the present invention. The removal of the faceplate 120 enables a more detailed view of the internal componentry and disparate microclimates within the passageway. The circularly shaped arrows may be used to represent a microclimate proximate the sensor componentry generating heat that rises upwardly towards an upper microclimate within an upper portion of the passageway. The heat generated by modules 122 may be dissipated with the vertical alignment interacting with the horizontal airflow, and the heat generated by the sensor componentry may rise vertically to be pushed out of the passageway using the same, horizontally directed airflow. Various connectors and adapters may be included within front and rear plates to facilitate providing connection mechanisms between the internal componentry and external features, optionally relative to the inlet and outlet apertures so as to avoid overly interfering with the airflow.

FIG. 15 illustrates a schematic overview of airflow through the smart arm 30 in accordance with one non-limiting aspect of the present invention. The vertically traveling airflow within the light pole 14 may enter through the inlet 100 and travel to the outlet 102 through the passageway whereafter the T-shape ducting in the tenon 104 may direct airflow upwardly and/or downwardly. The microclimates within the housing (shown with circular arrows) may feed heat into the horizontally traveling airflow in a manner sufficient to dissipate the heat. One non-limiting aspect of the present invention contemplates a temperature controller 124 having a plurality of non-transitory instructions stored on a computer-readable medium, which when executed with an associated processor, may be sufficient to facilitate actively and passively controlling cooling of the smart arm 30, i.e., controlling airflow through the passageway in a desired manner. The ability to properly control cooling within the smart arm 30 may be advantageous in assuring accuracy of the sensors 90, 92, 94, 96, particularly since the accuracy and precision of the sensors 90, 92, 94, 96 can be influenced when temperatures within the housing exceed relatively narrow operating ranges for the sensors 90, 92, 94, 96.

One difficulty associated with insuring sufficient cooling and temperature control of the sensors 90, 92, 94, 96 may be associated with a need to isolate an interior of the housing 98 from the ambient environment. As shown in FIG. 14, the bottom plate 116 may include openings 126, 128, 130 to interface measurement elements of the sensors 90, 92, 94, 96 with the ambient environment, however, these openings 126, 128, 130 may require isolation or sealing from the interior of the housing 98 in order to ensure measurements are made according to conditions within the ambient environment as opposed to conditions within the housing 98. An isolator 136, such as a gasket or other sealant, may be disposed between the bottom plate 116 and componentry of the sensors 90, 92, 94, 96 to ensure isolation of the passageway environment from the ambient environment, i.e., to enable the measurement elements to interact with the ambient environment without being influenced by the passageway environment. This required isolation can also cause enhanced heating within the housing 98 due to a greenhouse type of effect resulting from radiated heat passing through the housing 98 being trapped within the interior, which can be enhanced due to the passageway being sealed by the isolator 136 and other features from the ambient environment.

The active and passive cooling modes contemplated by the present invention may be beneficial in addressing the difficulties associated with sealing the sensors 90, 92, 94, 96 from the passageway environment while also providing some manner of airflow through the passageway sufficient to facilitate componentry cooling. While the present invention contemplates include incorporating vents, coolant systems, cooling fins or other cooling elements within the housing 98, the use of such features may be disadvantageous due to the possibility of such elements contaminating the sensors 90, 92, 94, 96. In order to work properly, the sensor componentry may need to be operating within a specific temperature range and the ambient environment may need to be uninfluenced by the smart arm operation, such as by avoiding contaminating the sensors with venting airflow or coolant towards or near the sensors 90, 92, 94, 96. To avoid contaminating the sensors 90, 92, 94, 96 while also allowing sufficient cooling, the temperature control module 124 may toggle between passive cooling and active cooling. The active cooling may correspond with actuating a fan 140 to an on state such that a propeller, blades or other pressure generating feature produces a draft or suction sufficient for drawing airflow from the inlet 100 to the outlet 102 and thereafter downwardly through the tenon 104. The passive cooling mode may correspond with the temperature controller 124 actuating the fan 140 to an off state such that the airflow follows a natural convection path from the inlet 100 to the outlet 102 and thereafter upwardly through the tenon 104.

One or more temperature sensors may be included at different locations within the housing 98 to facilitate generating feedback for the temperature controller 124. Temperature sensors, for example, may be associated with each of the sensors 90, 92, 94, 96 and other componentry within the housing 98, such as a step down converter 142, to identify whether the sensors 90, 92, 94, 96 and/or other components within the housing 98 are operating within improper temperature ranges and/or whether other components within the smart arm may be generating heat likely to influence the sensors 90, 92, 94, 96. The temperature control module 124 can utilize this feedback to facilitate toggling the fan 140 between passive and active modes and/or toggling the fan between different speeds depending on an amount of airflow needed, i.e., the fan speed can be gradually or incrementally increased/decreased in order to generate more/less airflow. In this manner, the present invention contemplates suspending and arranging componentry within the housing 98 and utilizing airflow control mechanisms to facilitate maintaining sensitive sensors within desired temperature ranges while also doing so without unduly influencing capabilities of the sensors to measure the ambient environment.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A smart arm comprising:
a sensor for sensing one or more conditions within an ambient environment of a light pole, the sensor relying on a measurement element to facilitate sensing the ambient environment;
a housing for mounting the sensor to the light pole, the housing including an inlet at one end and an outlet at another end, the housing defining a passageway between the inlet and the outlet, the inlet being positioned proximate an aperture leading to an interior of the light pole when the housing is mounted to the light pole, the passageway directing at least part of an airflow from the interior through the housing to cool the sensor; and
an isolator for isolating the passageway from the measurement element, the isolator preventing the airflow in the passageway from contaminating the sensor.

2. The smart arm of claim 1 wherein the isolator is a gasket positioned between a sensor opening and a cover of the sensor, the sensor opening leading to the ambient environment.

3. The smart arm of claim 1 further comprising a temperature sensor mounted proximate to the sensor, the temperature sensor outputting a temperature reading to a temperature control module included within the housing.

4. The smart arm of claim 3 wherein the temperature control module includes a plurality of non-transitory instructions stored on a computer-readable medium, the non-transitory instructions being executable with a processor of the temperature control module to facilitate:
implementing a passive cooling mode when the temperature reading fails to exceed a threshold; and
implementing an active cooling mode when the temperature reading exceeds the threshold.

5. The smart arm of claim 4 further comprising:
a fan operable to facilitate drawing the airflow through the passageway, the fan being operable at least between an on state and an off state, the on state rotating an impeller of the fan to draw the airflow through the passageway, the off state stopping rotation of the impeller;
the passive cooling mode corresponding with the temperature control module directing the fan to the off state; and
the active cooling mode corresponding with the temperature control module directing the fan to the on state.

6. A smart arm comprising:
a sensor for sensing one or more conditions within an ambient environment of a light pole, the sensor relying on a measurement element to facilitate sensing the ambient environment;
a housing for mounting the sensor to the light pole, the housing including an inlet at one end and an outlet at another end, the housing defining a passageway between the inlet and the outlet, the inlet being positioned proximate an aperture leading to an interior of the light pole when the housing is mounted to the light pole, the passageway directing at least part of an airflow from the interior through the housing to cool the sensor;
a fan positioned outboard of the outlet, the fan creating a pressure differential sufficient for drawing the airflow through the passageway; and
a tenon attached to the housing outboard of the outlet, the tenon having a T-shaped duct sufficient for directing the airflow received from the outlet in an upward direction toward a top opening and in a downward direction toward a bottom opening, thereby directing the airflow in the passageway away from the measurement element.

7. The smart arm of claim 6 wherein the fan is positioned proximate the bottom opening below a bottom of the outlet.

8. The smart arm of claim 7 further comprising a luminaire mounted proximate the top opening.

9. The smart arm of claim 7 further comprising a post top module (PTM) mounted proximate the top opening.

10. A smart arm comprising:
a sensor for sensing one or more conditions within an ambient environment of a light pole, the sensor relying on a measurement element to facilitate sensing the ambient environment;
a housing for mounting the sensor to the light pole, the housing including an inlet at one end and an outlet at another end, the housing defining a passageway between the inlet and the outlet, the inlet being positioned proximate an aperture leading to an interior of the light pole when the housing is mounted to the light pole, the passageway directing at least part of an airflow from the interior through the housing to cool the sensor; and
wherein the inlet includes a first plurality of apertures and the outlet includes a second plurality of apertures, the first plurality of apertures extending heightwise across substantially an entirety of the inlet, the second plurality of apertures extending heightwise across less than half of the outlet, thereby inducing a sloping direction to the airflow through the passageway.

11. A light pole comprising:
an elongated body having a hollow interior, the hollow interior extending between a bottom end and a top end;
a plurality of antennas attached to an exterior of the body, the antennas each having at least one conductor encased within a housing, the conductors resonating at one or more frequencies according to signaling from a controller;
a smart arm having at least one sensor for sensing one or more conditions within an ambient environment of a light pole, the sensor relying on a measurement element to facilitate sensing the ambient environment;
a lighting fixture attached to a tenon of the smart arm;
a housing for mounting the sensor to the body, the housing including an inlet at one end and an outlet at another end, the housing defining a passageway between the inlet and the outlet, the inlet being positioned proximate an aperture leading to an interior of the light pole when the housing is mounted to the light pole, the passageway directing at least part of an airflow from the interior through the housing to cool the sensor;
a fan operable to facilitate drawing the airflow through the passageway, the fan being operable at least between an on state and an off state, the on state rotating an impeller of the fan to draw the airflow through the passageway, the off state stopping rotation of the impeller;
a temperature control module having a plurality of non-transitory instructions stored on a computer-readable medium, the non-transitory instructions being executable with a processor of the temperature control module to facilitate:
implementing a passive cooling mode when a temperature reading fails to exceed a threshold, the passive cooling mode corresponding with the temperature control module directing the fan to the off state; and implementing an active cooling mode when the temperature reading exceeds the threshold, the active cooling mode corresponding with the temperature control module directing the fan to the on state.

12. The light pole of claim 11 wherein the antennas are each attached to the body with two fasteners, each fastener attaching through apertures included at opposite ends of the corresponding antenna to minimize levering.

13. The light pole of claim 12 wherein a wiring connects to the conductors between the two fasteners.

14. The light pole of claim 13 wherein at least one locating pin encased within the housing of each antenna positions the conductor within a mold prior to pouring of a material used to encase the conductor.

15. The light pole of claim 14 wherein the material is radio frequency (RF) neutral and electrically isolating.

16. The light pole of claim 14 wherein no printed circuit boards (PCBs) or processors are included within the material.

* * * * *